United States Patent
Maruyama et al.

(10) Patent No.: US 11,398,449 B2
(45) Date of Patent: Jul. 26, 2022

(54) SEMICONDUCTOR DEVICE AND WIRE BONDING METHOD

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kazuya Maruyama, Higashikurume Tokyo (JP); Tsutomu Sano, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/007,357

(22) Filed: Aug. 31, 2020

(65) Prior Publication Data
US 2021/0288019 A1 Sep. 16, 2021

(30) Foreign Application Priority Data
Mar. 12, 2020 (JP) .............................. JP2020-043135

(51) Int. Cl.
*H01L 23/49* (2006.01)
*H01L 23/00* (2006.01)

(52) U.S. Cl.
CPC .............. *H01L 24/48* (2013.01); *H01L 23/49* (2013.01); *H01L 24/14* (2013.01); *H01L 24/78* (2013.01); *H01L 2224/48455* (2013.01); *H01L 2224/48465* (2013.01); *H01L 2224/78302* (2013.01); *H01L 2924/13091* (2013.01)

(58) Field of Classification Search
CPC ......... H01L 24/48; H01L 24/49; H01L 23/49; H01L 24/14; H01L 24/78; H01L 2224/48455; H01L 2224/48465; H01L 2224/78302; H01L 2924/13091
USPC .......................................................... 257/738
See application file for complete search history.

(56) References Cited

U.S. PATENT DOCUMENTS

| | | | | |
|---|---|---|---|---|
| 2011/0163392 | A1* | 7/2011 | Fujioka | H01L 24/06 257/401 |
| 2012/0256314 | A1* | 10/2012 | Har | H01L 23/4952 257/738 |
| 2019/0326248 | A1* | 10/2019 | Hori | H01L 24/48 |

FOREIGN PATENT DOCUMENTS

| | | |
|---|---|---|
| JP | 3882734 B2 | 2/2007 |
| JP | 2012-195459 A | 10/2012 |
| JP | 2019-135761 A | 8/2019 |

* cited by examiner

*Primary Examiner* — Didarul A Mazumder
(74) *Attorney, Agent, or Firm* — Kim & Stewart LLP

(57) ABSTRACT

A semiconductor device includes a semiconductor chip having an electrode pad, a terminal having a terminal pad, and a bonding wire. The bonding wire includes a first end portion, a first bonded portion bonded to the electrode pad, a loop portion extending between the semiconductor chip and the terminal, and a second bonded portion bonded to the terminal pad. The second bonded portion is a wedge bonded portion comprising a second end portion of the bonding wire opposite to the first end portion. A length of the first bonded portion in the first direction is greater than a length of the second bonded portion in the first direction.

18 Claims, 15 Drawing Sheets

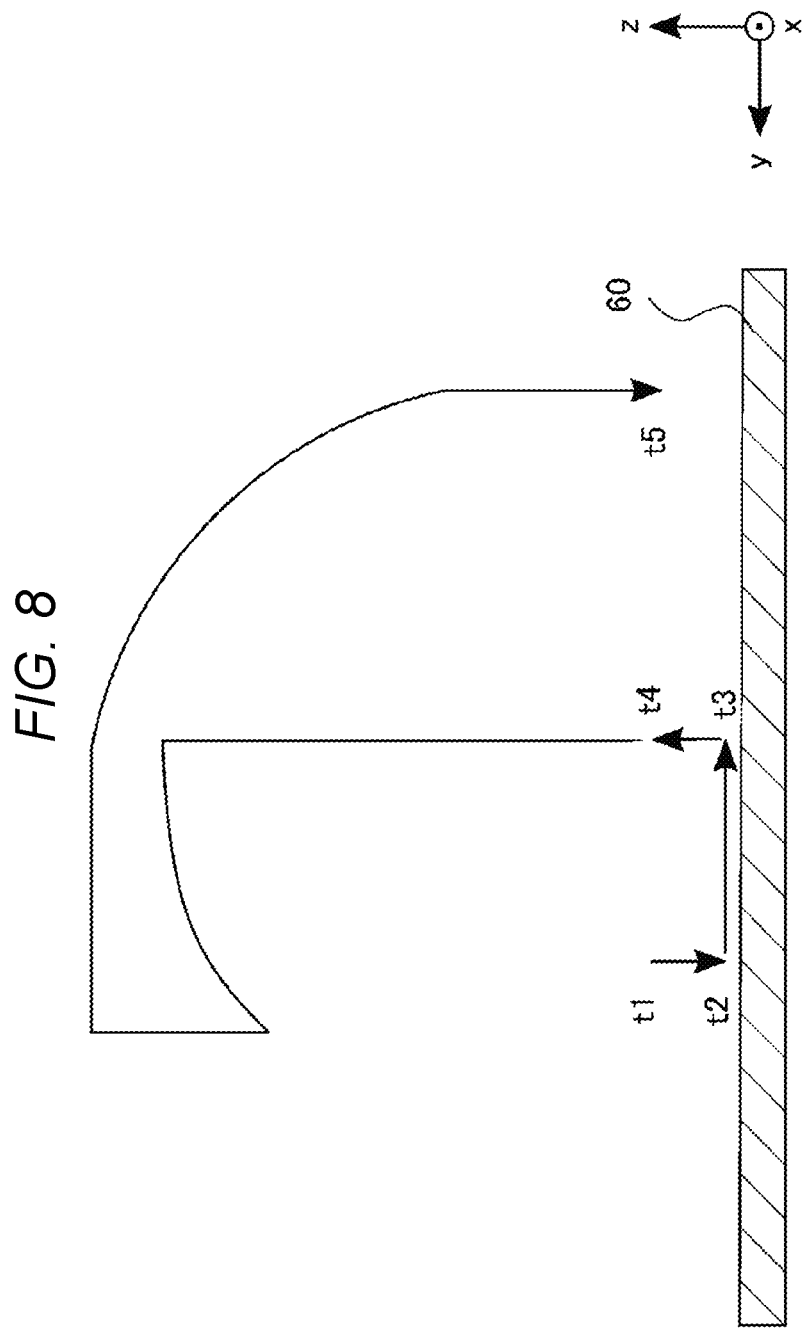

SEMICONDUCTOR DEVICE AND WIRE BONDING METHOD

CROSS-REFERENCE TO RELATED APPLICATION(S)

This application is based upon and claims the benefit of priority from Japanese Patent Application No. 2020-043135, filed on Mar. 12, 2020, the entire contents of which are incorporated herein by reference.

FIELD

Embodiments described herein relate generally to a semiconductor device and a wire bonding method.

BACKGROUND

In a power semiconductor device, various methods for connecting a semiconductor element and a terminal are proposed.

BRIEF DESCRIPTION OF THE DRAWINGS

FIG. 8 is a diagram illustrating a trajectory of a bonding tool used in the wire bonding method in manufacturing the semiconductor device according to the embodiment.

DETAILED DESCRIPTION

In general, according to an embodiment, a semiconductor device includes a semiconductor chip having an electrode pad, a terminal having a terminal pad, and a bonding wire extending in a first direction. The bonding wire includes a first end portion, a first bonded portion bonded to the electrode pad, a loop portion extending between the semiconductor chip and the terminal, and a second bonded portion bonded to the terminal pad. The second bonded portion is a wedge bonded portion comprising a second end portion of the bonding wire opposite to the first end portion. A length of the first bonded portion in the first direction is greater than a length of the second bonded portion in the first direction.

Hereinafter, example embodiments will be described with reference to the drawings. In descriptions, those elements or aspects having substantially the same functions and configurations are designated by the same reference symbols. Each of the example embodiments embodies a technical idea or concept of the present disclosure, the examples are non-limiting with regard to such matters as exemplified materials, shapes, structures, arrangements, and the like of elements, which may be modified in various ways.

1. Embodiment

In the following, as an example of a semiconductor device, a semiconductor device having a metal oxide semiconductor field effect transistor (MOSFET) as a semiconductor element is shown. However, the semiconductor element is not limited to MOSFETs. For example, other transistors such as an insulated gate bipolar transistor (IGBT) and a bipolar junction transistor (BJT) may be used.

1.1 Configuration

First, a configuration of the semiconductor device according to the embodiment will be described.

1.1.1 Overall Configuration of Semiconductor Device

Figure 1:
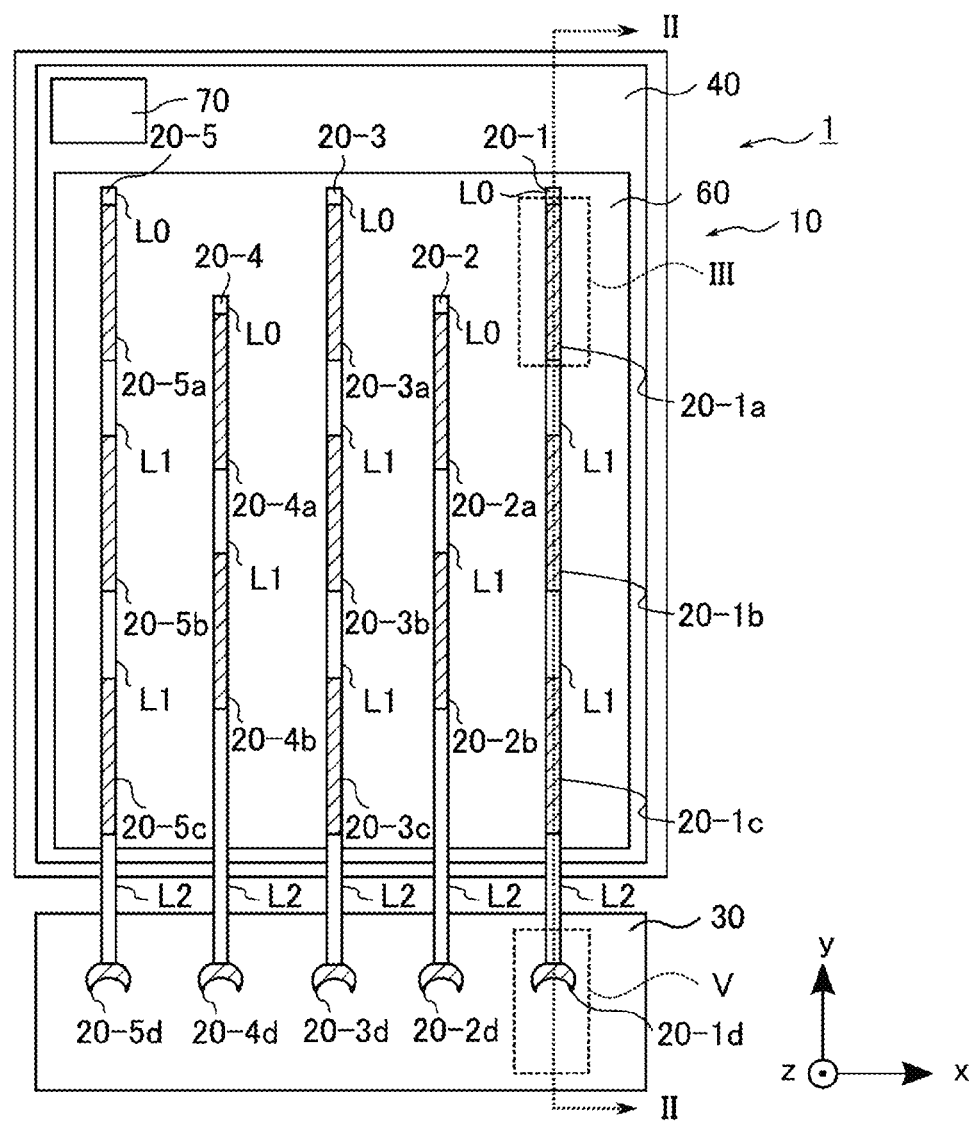
FIG. 1 illustrates a plan view of a semiconductor device according to an embodiment.
Figure 2:
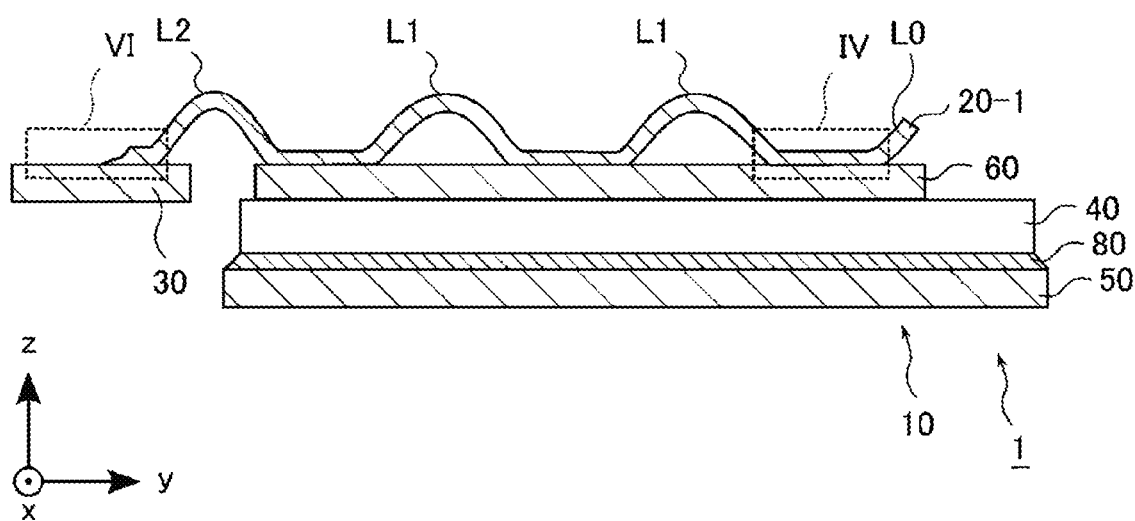
FIG. 2 illustrates a cross-sectional view of the semiconductor device taken along a line II-II in FIG. 1.

FIG. 1 illustrates a plan view of an overall configuration of the semiconductor device according to the embodiment. FIG. 2 illustrates a cross-sectional view of the semiconductor device taken along the line II-II in FIG. 1. Although not specifically illustrated, the semiconductor device may be sealed with or packaged within a resin or the like.

As illustrated in FIGS. 1 and 2, a semiconductor device 1 includes a MOSFET 10, a terminal 30 provided outside the MOSFET 10, and a plurality of wires 20 (more particularly wires 20-1, 20-2, 20-3, 20-4, and 20-5) electrically connecting the MOSFET 10 and the terminal 30. Although five wires 20-1 to 20-5 are illustrated in the examples of FIGS. 1 and 2, the number of wires is not limited to five. The MOSFET 10 is an example of a semiconductor element included in the semiconductor device 1, and may be in a form of a chip. The wires 20 may be referred to as bonding wires.

The MOSFET 10 includes a semiconductor substrate 40, a drain electrode 50, a source electrode 60, and a gate electrode 70.

In the drawings, a plane parallel to the semiconductor substrate 40 is defined as an x-y plane, and a direction perpendicular to the x-y plane and extending from the semiconductor substrate 40 to the source electrode 60 is a z direction (also referred to as an upward direction or the like). In the x-y plane, the direction along which the plurality of wires 20 are spaced is an x direction and a direction along which the MOSFET 10 and the terminal 30 are spaced from each other is a y direction.

The semiconductor substrate 40 is, for example, a silicon (Si) substrate or a silicon carbide (SiC) substrate. The semiconductor substrate 40 may be a semiconductor substrate of nitride such as gallium nitride (GaN), aluminum gallium nitride (AlGaN), or indium gallium nitride (InGaN), a gallium oxide (GaO) substrate, or a diamond semiconductor substrate.

The drain electrode 50 is provided below the semiconductor substrate 40 and is electrically connected to a lower surface of the semiconductor substrate 40. The drain electrode 50 is, for example, a plate-shaped or thin-film electrode containing aluminum, copper, silver, or gold. In the example of FIG. 2, the drain electrode 50 is fixed to the semiconductor substrate 40 using a conductive paste 80. However, the drain electrode 50 only needs to be electrically connected to the lower surface of the semiconductor substrate 40 and the fixing method thereof is not particularly limited.

The source electrode 60 is an example of a first pad or an electrode pad. The source electrode 60 is provided on an upper surface of the semiconductor substrate 40 and is electrically connected to the upper surface of the semiconductor substrate 40. The source electrode 60 is a plate-shaped or thin-film electrode containing aluminum. The source electrode 60 may be a plate-shaped or thin-film electrode containing copper, silver, gold, or the like. A first end of each of the wires 20 is bonded to the upper surface of the source electrode 60.

The gate electrode 70 is provided above the semiconductor substrate 40 via the gate insulating film. The gate insulating film is made of, for example, silicon oxide.

In the example of FIG. 1, the source electrode 60 is provided in a central region of the upper surface of the semiconductor substrate 40, and the gate electrode 70 is provided outside the central region in a region smaller than the source electrode 60. Such a MOSFET 10 may be employed, for example, when the speed required in a switching operation is relatively low.

The terminal 30 or a portion thereof is an example of a second pad or a terminal pad, and is provided apart from the MOSFET 10 in the y direction. The terminal 30 is made of, for example, copper. The terminal 30 may be made of silver, gold, palladium, nickel, aluminum, or the like. The terminal 30 may be, for example, one in which an upper surface of copper or the like is coated with silver, gold, palladium, nickel, aluminum, or the like. A second end of each of the wires 20 is joined to the upper surface of the terminal 30.

The wires 20-1 to 20-5 are arranged in this order along the x direction and each extends in the y direction when viewed from above. As described above, the wires 20-1 to 20-5 have first ends joined to the source electrode 60 and second ends joined to the terminal 30.

More specifically, the wire 20-1 has joint portions 20-1a, 20-1b, and 20-1c with the source electrode 60 and a joint portion 20-1d with the terminal 30. The joining portions 20-1d, 20-1c, 20-1b, and 20-1a are arranged in this order along the y direction. The wire 20-2 has joint portions 20-2a and 20-2b with the source electrode 60 and a joint portion 20-2d with the terminal 30. The joining portions 20-2d, 20-2b, and 20-2a are arranged in this order along the y direction. The wire 20-3 has joint portions 20-3a, 20-3b, and 20-3c with the source electrode 60 and a joint portion 20-3d with the terminal. The joint portions 20-3d, 20-3c, 20-3b, and 20-3a are arranged in this order along the y direction.

The wire 20-4 has joint portions 20-4a and 20-4b with the source electrode 60 and a joint portion 20-4d with the terminal 30. The joint portions 20-4d, 20-4b, and 20-4a are arranged in this order along the y direction. The wire 20-5 has joint portions 20-5a, 20-5b, and 20-5c with the source electrode 60 and joint portion 20-5d with the terminal 30. The joint portions 20-5d, 20-5c, 20-5b, and 20-5a are arranged in this order along the y direction.

Each of the joints 20-1a, 20-1b, 20-1c, 20-2a, 20-2b, 20-3a, 20-3b, 20-3c, 20-4a, 20-4b, 20-5a, 20-5b, and 20-5c is an example of the first portion and may be hereinafter referred to as a first joint portion J1. Each of the joint portions 20-1d, 20-2d, 20-3d, 20-4d, and 20-5d is an example of the second portion and may be referred to as a second joint portion J2. In the present disclosure, the "joint portion" may also be referred to as a bonded portion.

Each of the wires 20 has loop portions L1 and L2 which are not joined to the source electrode 60 or the terminal 30. The loop portions L1 connects between the joint portions on the source electrode 60 (that is, for example, on the wire 20-1, a loop portion L1 is between the joint portion 20-1a and the joint portion 20-1b, and another loop portion L1 is between the joint portion 20-1b and the joint portion 20-1c The loop portion L2 connects between the last joint portion on the source electrode 60 and the joint portion on the terminal 30 (that is, for example, on wire 20-1, a loop portion L2 is between the joint portion 20-1c and the joint portion 20-1d).

Each of the wires 20 has an end portion L0 which is not in direct contact with the source electrode 60 at the first end. That is, the joint portions 20-1a, 20-2a, 20-3a, 20-4a, and 20-5a are formed between the end portion L0 and the loop portion L1. As such, each of the wires 20 is joined to the source electrode 60 not by ball bonding in which the first joint portion J1 becomes the first end, but by wedge bonding in which the end portion L0 not in contact with the source electrode 60 becomes the first end.

The wires 20 contains, for example, copper, but is not limited to copper, and may contain gold, silver, or aluminum. Each wire 20 may have a core material containing copper, gold, silver, aluminum, or the like covered with a coating material such as palladium.

The diameter of the wires 20 is not particularly limited. As described above, in the embodiment, the source electrode 60 and each of the wires 20 are joined by wedge bonding. Alternatively, the semiconductor device according to this embodiment may be manufactured by using a wire bonder (wedge bonder) used for bonding wires having a relatively large diameter (for example, 100 μm or more) or by using a wire bonder (ball bonder) used for bonding wires having a relatively small diameter (for example, 100 μm or less). Therefore, either a wire having a diameter of 100 μm or more or a wire having a diameter of less than 100 μm may be used as wires 20.

Next, the arrangement of the joint portions between the source electrode 60 and the plurality of wires 20 will be described.

The joint portions 20-1a, 20-1b, and 20-1c of the wire 20-1 have a region on the source electrode surface that partially overlaps along the x direction with at least one of the joint portions 20-2a and 20-2b of the wire 20-2, which is adjacent to the wire 20-1. The other wires 20 are similar to the wire 20-1 in this regard in that each joint portion with the source electrode 60 has a region that partially overlaps the joint portion of an adjacent wire 20 in the x direction.

More specifically, the plurality of first joint portions J1 are arranged in a staggered pattern, for example. That is, the first joint portion J1 of one of two adjacent wires and the first joint portion J1 of the other wire (for example, joint portions 20-1a to 20-1c and joint portions 20-2a and 20-2b) are displaced (offset) from each other in the y direction. In the embodiment, the length along the y direction of each first joint portions J1 on each of the wires 20 is longer than the length along the y direction of the loop portions L1. Therefore, in a plan view, one first joint portion J1 on one of the two adjacent wires and another first joint portion J1 of the other wire of the two adjacent wires have a portion facing each other in the x direction and also a portion not facing each other in the x direction.

The plurality of loop portions L1 are arranged, for example, in a staggered pattern, similar to the plurality of first joint portions J1. That is, one loop portion L1 of two adjacent wires and the other loop portion L1 (for example, a plurality of loop portions L1 formed by the wire 20-1 and a plurality of loop portions L1 formed by the wire 20-2) are arranged in a staggered manner along the y direction. As described above, the length of one first joint portion J1 along the y direction is longer than the length of one loop portion L1 along the y direction. Therefore, in a plan view, one loop portion L1 and the other loop portion L1 of two adjacent wires do not face each other along the x direction.

The arrangement of the joint portions in FIG. 1 is merely an example and the arrangement may be modified in various ways.

1.1.2 Details of First Joint Portion

Next, details of the first joint portion J1 will be described with reference to FIGS. 3 and 4.

Figure 3:
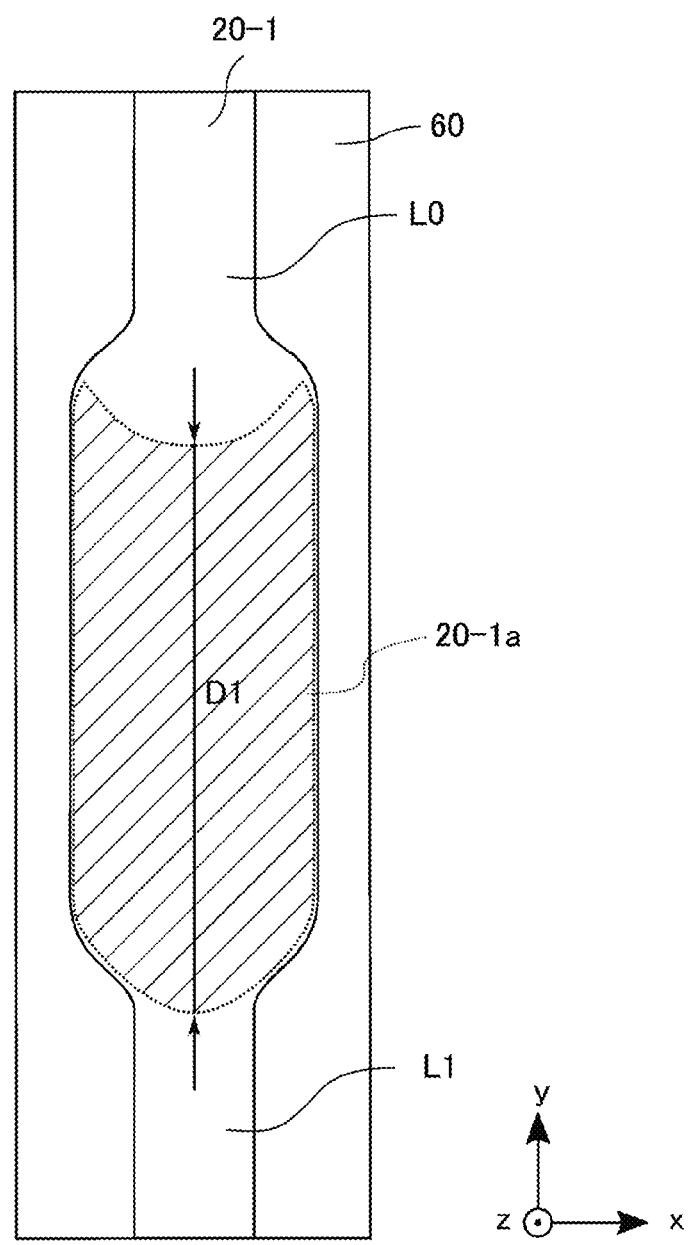
FIG. 3 illustrates an enlarged plan view of a region III in FIG. 1, which includes a first joint portion in the semiconductor device according to the embodiment.

FIG. 3 illustrates an enlarged plan view of a region III in FIG. 1, which illustrates the detailed shape of the joint portion 20-1a. FIG. 4 illustrates an enlarged cross-sectional view of a region IV in FIG. 2 and corresponds to FIG. 3. In FIGS. 3 and 4, the joint portion 20-1a is illustrated as an example of the first joint portion J1, but the other first joint portion J1 has the same structure as the joint portion 20-1a, and therefore the description thereof is omitted.

As illustrated in FIG. 3, the joint portion 20-1a corresponds to a region of the wire 20-1 surrounded by a broken line in FIG. 3. The wire 20-1 joins with the source electrode 60 in the region. The region has a length D1 along the y direction. That is, the wire 20-1 is joined to the source electrode 60 in the joint portion 20-1a over the length D1 along the y direction. As will be described below, the wire 20-1 is pressed and joined to the source electrode 60 by the bonding tool. Therefore, the width of the wire 20-1 along the x direction may be longer in the region corresponding to the joint portion 20-1a than in the loop portion L1.

Figure 4:
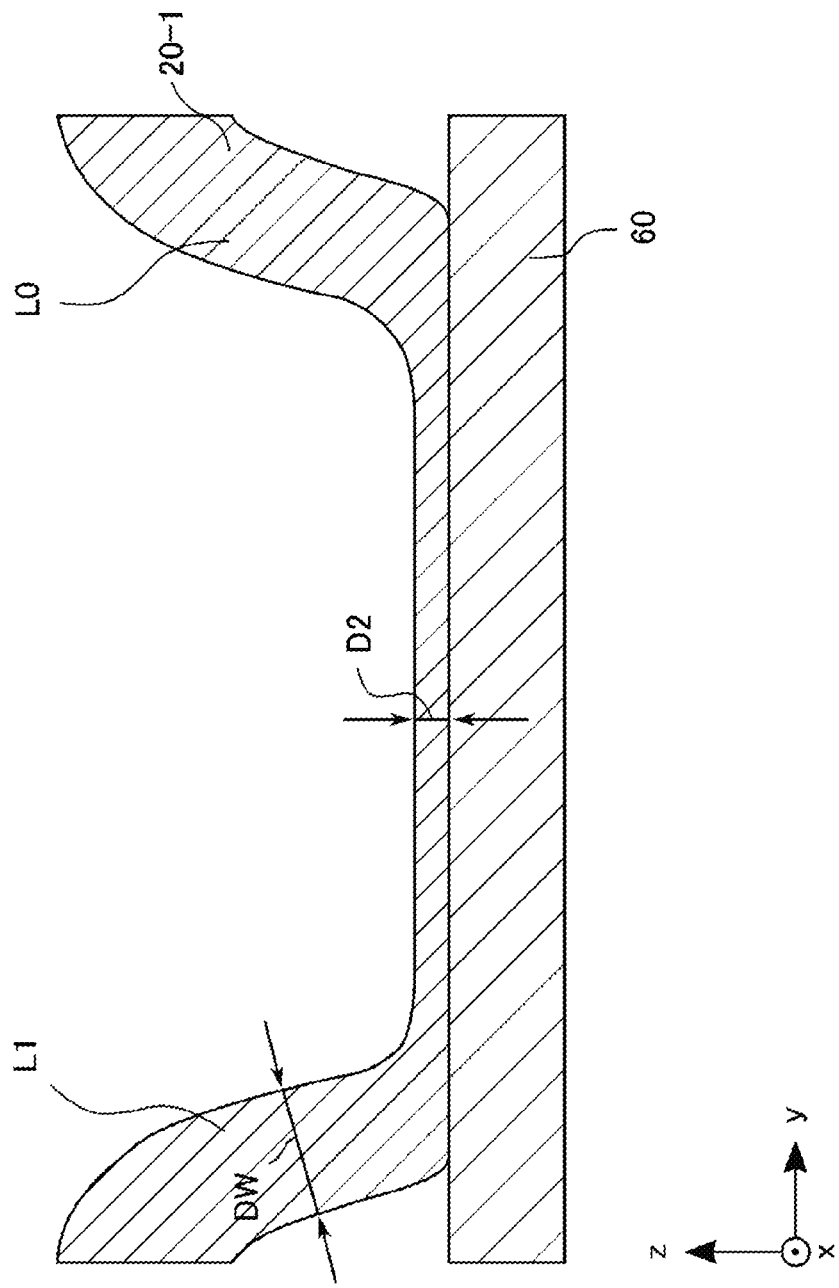
FIG. 4 illustrates an enlarged cross-sectional view of a region IV in FIG. 2, which includes the first joint portion in the semiconductor device according to the embodiment.

As illustrated in FIG. 4, a thickness D2 in the z direction of the joint portion 20-1a of the wire 20-1 is smaller than a diameter DW of the loop portion L1 of the wire 20-1 and is approximately constant in the above region corresponding to the joint portion 20-1a.

1.1.3 Details of Second Joint Portion

Next, details of the second joint portion J2 will be described with reference to FIGS. 5 and 6.

Figure 5:
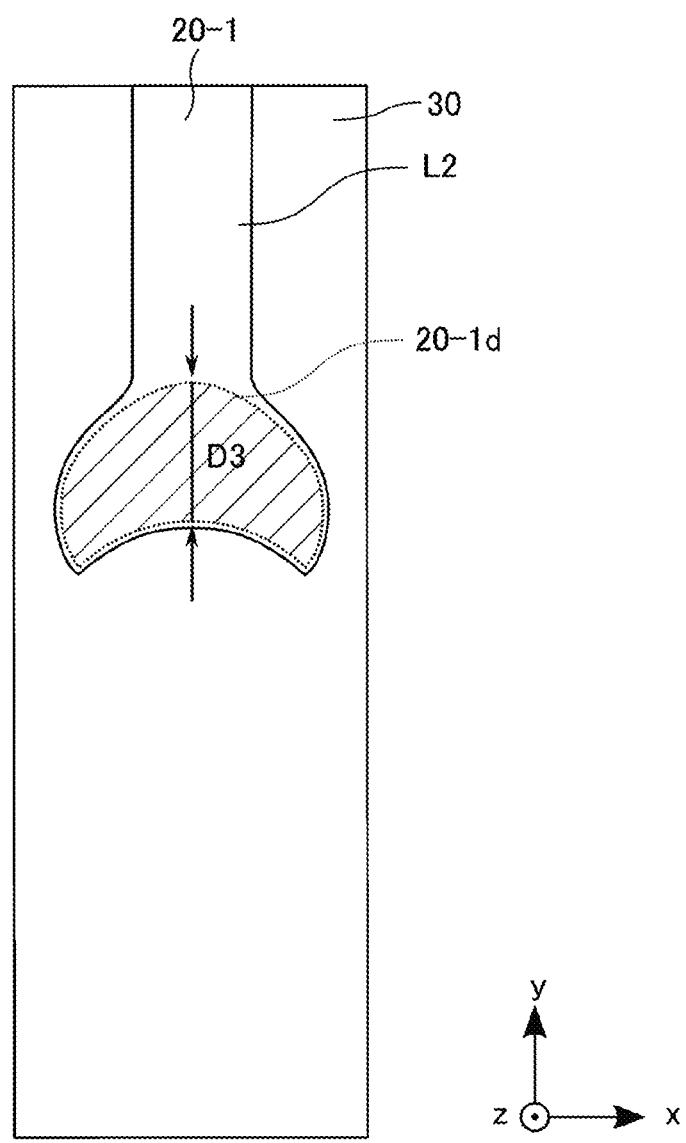
FIG. 5 illustrates an enlarged plan view of a region V in FIG. 1, which includes a second joint portion of the semiconductor device according to the embodiment.

FIG. 5 illustrates an enlarged plan view of a region V in FIG. 1, which illustrates the detailed shape of the joint portion 20-1d. FIG. 6 illustrates an enlarged cross-sectional view of a region VI in FIG. 2 and corresponds to FIG. 5. In FIGS. 5 and 6, although the joint portion 20-1d is illustrated as an example of the second joint portion J2, the description of the other second joint portion J2 is omitted because it has the same structure as that of the joint portion 20-1d.

As illustrated in FIG. 5, the joint portion 20-1d corresponds to a region of the wire 20-1 surrounded by a broken line in FIG. 5. The wire 20-1 is joined to the terminal 30 in the region. This region has a length D3 along the y direction. That is, the wire 20-1 is joined to the terminal 30 in the joint portion 20-1d over the length D3 along the y direction. As will be described below, the wire 20-1 is pressed and joined to the terminal 30 by the bonding tool. Therefore, the width of the wire 20-1 along the x direction may be longer in the region corresponding to the joint portion 20-1d than in the loop portion L2.

Figure 6:
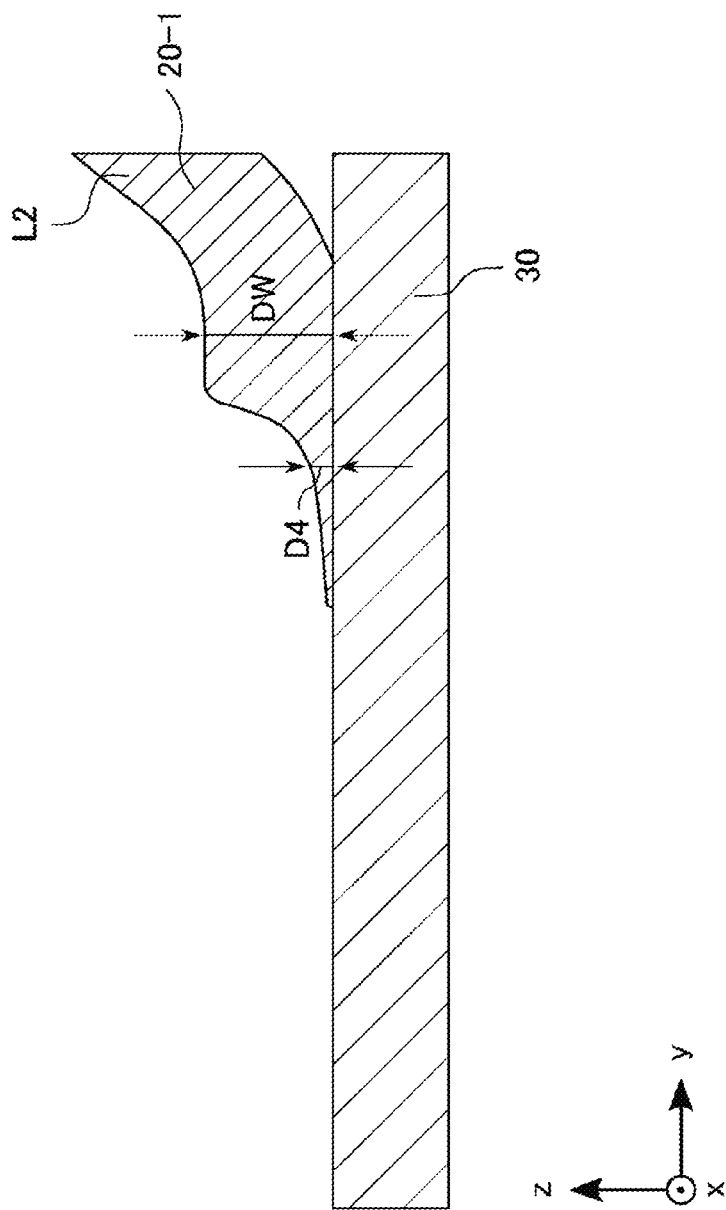
FIG. 6 illustrates an enlarged cross-sectional view of a region in of FIG. 2, which includes a second joint portion of the semiconductor device according to the embodiment.

As illustrated in FIG. 6, a thickness D4 of the wire 20-1 in the joint portion 20-1d in the z direction is smaller than the diameter DW of the wire 20-1 in the loop portion L2. Since the wire 20-1 is cut at the joint portion 20-1d, the joint portion 20-1d forms the second end of the wire 20-1. Therefore, the thickness D4 of the joint portion 20-1d can be gradually reduced toward the second end of the wire 20-1.

The length D1 of the first joint portion J1 illustrated in FIG. 3 along the y direction is greater than the length D3 of the second joint portion J2 illustrated in FIG. 5 along the y direction. The length of the first joint portion J1 illustrated in FIG. 3 along the x direction is approximately the same as the length of the second joint portion J2 illustrated in FIG. 5 along the x direction. Therefore, the first joint portion J1 has a larger joint area than the second joint portion J2.

1.2 Wire Bonding Method

Next, as a method of manufacturing the semiconductor device according to the embodiment, an example of a wire bonding method will be described.

Figure 7:
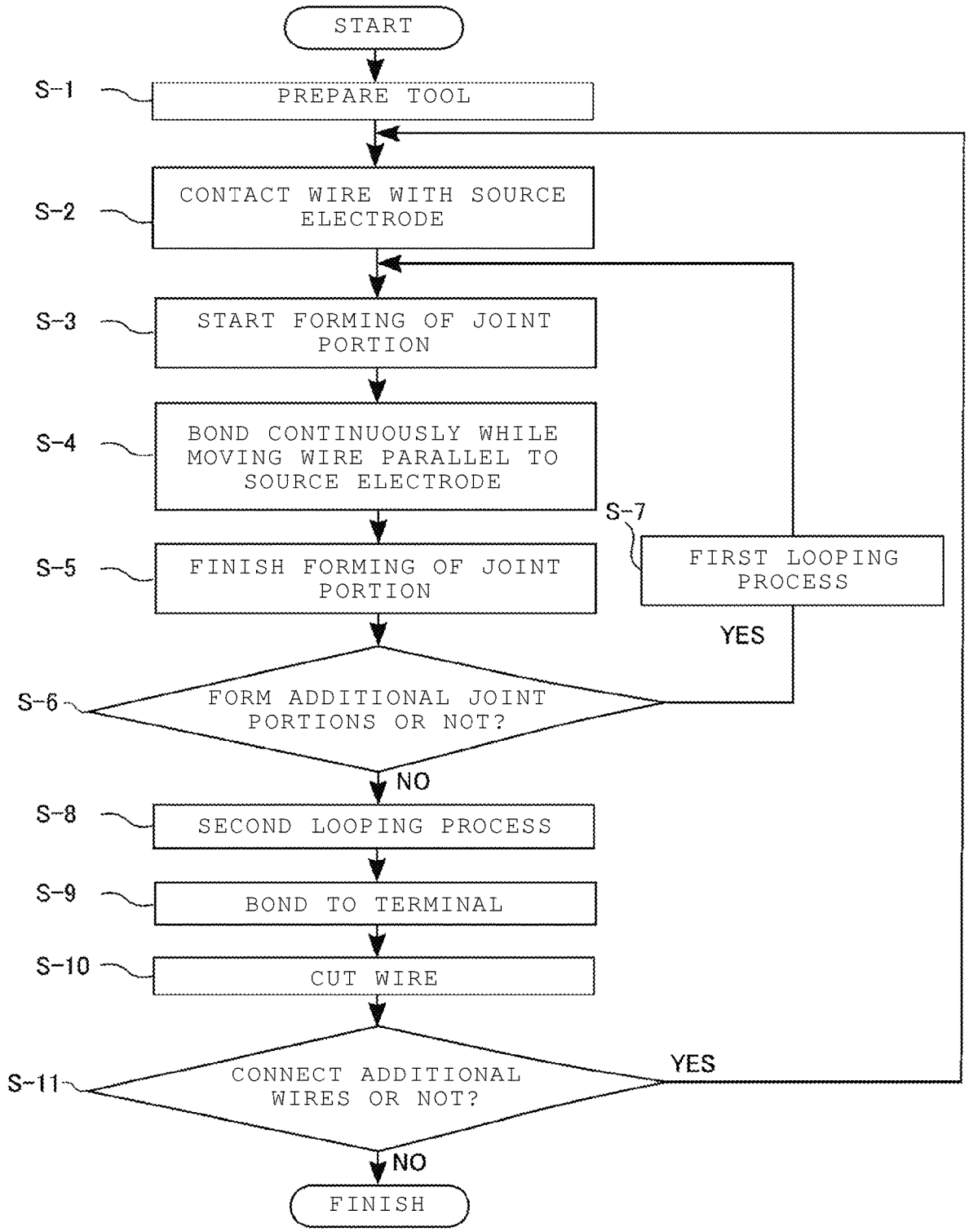
FIG. 7 is a flowchart illustrating a wire bonding method in manufacturing the semiconductor device according to the embodiment.
Figure 9A:
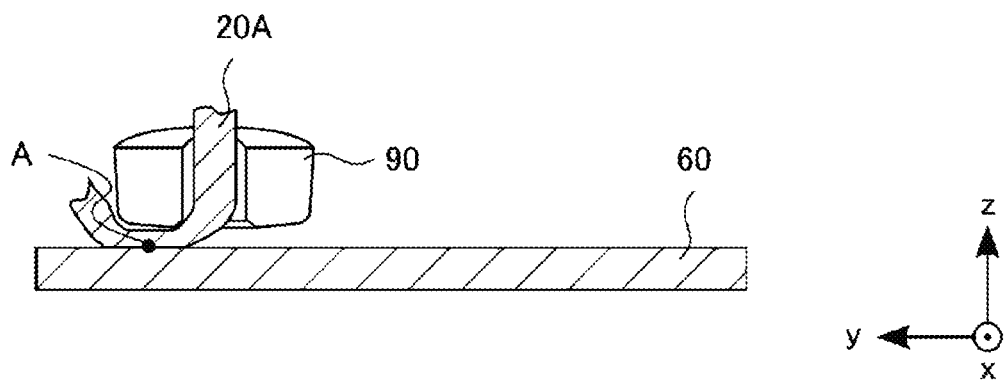
FIGS. 9A to 9D illustrate cross-sectional views of the bonding tool and the semiconductor device when performing a wire bonding method in manufacturing the semiconductor device according to the embodiment.
Figure 9B:
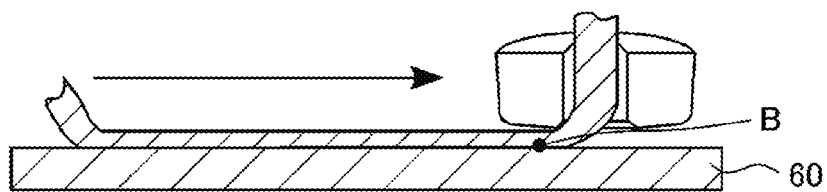
Figure 9C:
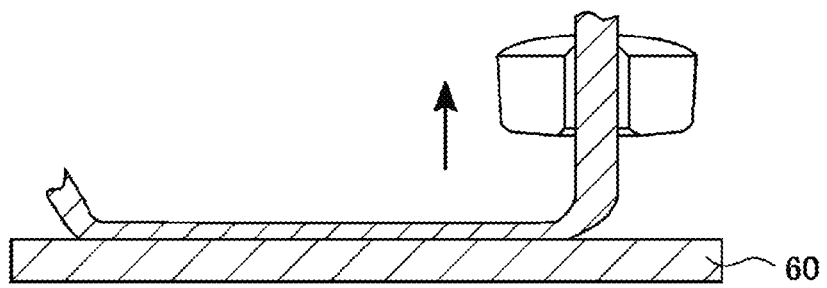
Figure 9D:
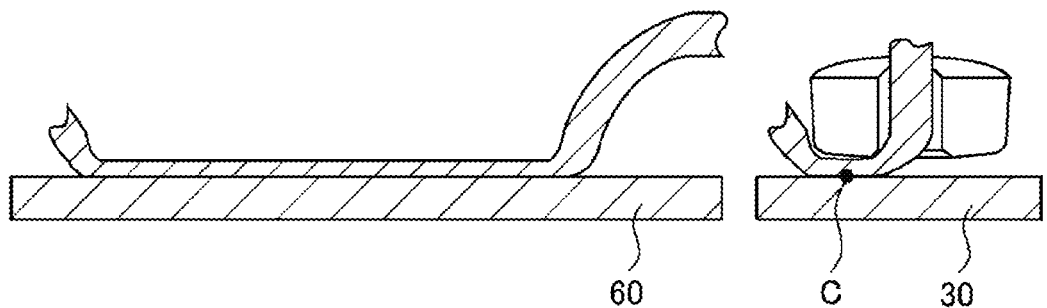

FIG. 7 is a flowchart illustrating a wire bonding method in manufacturing the semiconductor device according to the embodiment. FIG. 8 is a diagram illustrating a trajectory of a bonding tool (tool) in a wire bonder used in the wire bonding method illustrated in FIG. 7. FIGS. 9A to 9D are cross-sectional views of a bonding tool and a semiconductor device when executing the wire bonding method illustrated in FIG. 7. In FIG. 8, the trajectory of the bonding tool with respect to the source electrode 60 is schematically illustrated. In FIGS. 9A to 9D, steps of forming the first joint portion J1 is schematically illustrated in FIGS. 9A, 9B, and 9C and a step of forming the second joint portion J2 is schematically illustrated in FIG. 9D. In FIGS. 9A to 9D, the bonding tool referenced in FIGS. 7 and 8 is illustrated as a bonding tool 90.

Hereinafter, the wire bonding method will be described with reference to FIGS. 7 to 9D. In the following description, wire bonding will be performed using a wire bonder having the bonding tool 90. The bonding tool 90 is controlled by a wire bonder and has a function of joining a part of the wire to a joint target surface while holding the wire.

First, the MOSFET 10 and the terminal 30 are formed and disposed in the wire bonder.

Subsequently, as illustrated in FIG. 7, in Step S-1, the wire bonder controls the bonding tool 90 to extend wires 20A, which are materials of the wires 20, from a tip of the bonding tool 90.

In Step S-2, the wire bonder lowers the bonding tool 90 to bring the wire 20A extended in Step S-1 into contact with the source electrode 60. Specifically, in Step S-2, the wire bonder moves the bonding tool 90 as illustrated by the arrow from t1 to t2 in FIG. 8. Thereby, at the tip of the bonding tool 90, the wire 20A is interposed between the tip of the bonding tool 90 and the source electrode 60 along a radial direction.

In Step S-3, the wire bonder starts forming of the first joint portion J1. Specifically, the wire bonder presses the bonding tool 90 such that the wire 20A is pressed against the source electrode 60 with the tip of the bonding tool 90. Thereby, as illustrated in FIG. 9A, the wire 20A is joined to the source electrode 60 at a joint start position A which is an example of a first position. The wire bonder may join the wire 20A to the source electrode by performing ultrasonic vibration, heat, scrubbing operation, and the like in parallel, if necessary, in addition to the pressing operation.

In Step S-4, the wire bonder moves the bonding tool 90 from the joint start position A in parallel with the x-y plane (for example, along the y direction) while feeding the wire 20A from the tip of the bonding tool 90. Specifically, the wire bonder moves the bonding tool 90 as illustrated by the arrow from t2 to t3 in FIG. 8. Thereby, the wire 20A is fed from the bonding tool 90 while being pressed against the source electrode 60 by the tip of the bonding tool 90 while the bonding tool 90 moves from the joint start position A in parallel along the x-y plane. Therefore, as illustrated in FIG. 9B, the wire 20A is continuously joined to the source electrode 60 along the y direction from the joint start position A to a joint finish position B which is an example of a second position. The wire bonder may join the wire 20A to the source electrode by performing ultrasonic vibration, heat, scrubbing operation, and the like in parallel, if necessary, in addition to the pressing operation.

In Step S-5, the wire bonder finishes forming of the first joint portion J1. Specifically, the wire bonder raises the bonding tool 90 as illustrated by the arrow from t3 to t4 in FIG. 8. As a result, as illustrated in FIG. 9C, the wire bonder feeds a portion of the wire 20A which is not joined to the source electrode 60 from the tip of the bonding tool 90 along the z direction.

In Step S-6, the wire bonder determines whether to form a further first joint portion J1 on the source electrode 60. When it is determined that the first joint portion J1 (for example, the joint portion 20-1$a$) is formed and then the further first joint portion J1 (for example, the joint portion 20-1$b$) is formed (Step S-6; yes), the process proceeds to Step S-7, and when it is determined that the further first joint portion J1 is not formed (Step S-6; no), the process proceeds to Step S-8.

In Step S-7, the wire bonder moves the bonding tool 90 from the joint finish position B of the joint portion 20-1$a$ to the joint start position of the joint portion 20-1$b$ while feeding the wire 20A (first looping process of the wire 20A). The joint start position of the joint portion 20-1$b$ is an example of a fourth position. In the first looping process, the wire bonder moves, for example, the bonding tool 90 along a predetermined locus illustrated by the arrow from t4 to t5 in FIG. 8. Accordingly, the loop portion L1 can be formed between the joint finish position B of the joint portion 20-1$a$ and the joint start position of the joint portion 20-1$b$. After forming the loop portion L1, the process returns to Step S-3. Then, Steps S-3 to S-7 are repeated until it is determined in Step S-6 that no further first joint portion J1 is formed.

In particular, after the bonding tool 90 is moved to the joint start position of the joint portion 20-1$b$ in Step S-7, the wire 20A is joined to the joint start position of the joint portion 20-1$b$ in Step S-3. Next, in Step S-4, the wire 20A is continuously joined from the joint start position of the joint portion 20-1$b$ to the joint finish position of the joint portion 20-1$b$. Then, in Step S-5, the formation of the joint portion 20-1$b$ is finished. The joint finish position of the joint portion 20-1$b$ is an example of a fifth position.

Hereinafter, it is assumed that it is determined that no more first joint portion J1 is formed after the joint portions 20-1$a$, 20-1$b$, and 20-1$c$ are sequentially formed as the first joint portions J1.

In Step S-8, the wire bonder moves the bonding tool 90 from the joint finish position of the joint portion 20-1$c$ to a joint position of the joint portion 20-1$d$ while feeding the wire 20A (second looping process of the wire 20A). In the second looping process, the wire bonder moves, for example, the bonding tool 90 along a predetermined locus as in the first looping process. Accordingly, the loop portion L2 can be formed between the joint finish position of the joint portion 20-1$c$ and the joint position of the joint portion 20-1$d$.

In Step S-9, the wire bonder starts forming of the second joint portion J2. Specifically, the wire bonder lowers the bonding tool 90 to press the wire 20A against the terminal 30 at the tip of the bonding tool 90. As a result, as illustrated in FIG. 9D, the wire 20A is joined to the terminal 30 at a joint position C, which is an example of a third position. The wire bonder may bond the wire 20A to the terminal 30 by performing ultrasonic vibration, heat, scrubbing operation, and the like in parallel, if necessary, in addition to the pressing operation.

In Step S-10, the wire bonder cuts the wire 20A. In particular, the wire bonder raises the bonding tool 90 from the terminal 30 along the z direction by a predetermined amount while feeding the wire 20A from the tip of the bonding tool 90, and then applies tensile stress to the fed wire 20A to cut it. Thereby, the wire 20-1 including the first end having at least one first joint portion J1 and the second end having the second joint portion J2 is formed. The cutting operation of the wire 20A is not limited to the above example and a method of cutting the wire 20A by a pressing operation of the bonding tool 90 to the terminal 30 or a method of cutting the wire 20A using a wire cutter provided in the bonding tool 90 may be applied.

In Step S-11, the wire bonder determines whether to further connect the source electrode 60 and the terminal 30 with the wire 20A. When it is determined that the wire 20A is used to further connect the source electrode 60 and the terminal 30 (Step S-11; yes), the wire bonder moves the bonding tool 90 to a position forming a joint portion (for example, joint portion 20-2$a$ of the wire 20-2) of the wire which further connects the source electrode 60 and the terminal 30 without feeding the wire 20A. After that, the process returns to Step S-2, and Steps S-2 to S-11 are repeatedly executed until it is determined in Step S-11 that the source electrode 60 and the terminal 30 are not further connected.

When it is determined that the source electrode 60 and the terminal 30 are not further connected using the wire 20A (Step S-11; no), the wire bonder finishes the wire bonding operation.

As such, the source electrode 60 and the terminal 30 can be bonded with the plurality of wires 20, and finally the semiconductor device 1 can be manufactured.

According to the wire bonding method described above, by performing Step S-4, the length D1 of the first joint portion J1 along the y direction can be made longer than the length D3 of the second joint portion J2 along the y direction. The wire bonding method described above is an example for manufacturing the semiconductor device 1 and other processing may be inserted between the respective steps, or some steps may be omitted. The order of steps may be changed.

1.3 Effects of Embodiment

In a semiconductor device having a semiconductor element, it is effective to prevent an increase in ON resistance of the semiconductor device in order to improve power conversion efficiency. Therefore, it is preferable not only to prevent an increase in resistance due to an inside of the semiconductor element, but also to prevent an increase in resistance due to a conductor which electrically connects the source electrode of the semiconductor element and the external terminal of the semiconductor element.

According to the embodiment, the semiconductor device 1 uses the wires 20 as conductors which electrically connect the source electrode 60 and the terminal 30. The length D1 along the y direction of each of the first joint portions J1, which are the joint portions between the wires 20 and the source electrode 60, is longer than the length D3 along the y direction of each of the second joint portions J2, which are the joint portions between the wires 20 and the terminal 30. As a result, the joint area per first joint portion J1 increases, and as a result, the total joint area of the source electrode 60 and the plurality of wires 20 increases. Therefore, it is possible to prevent an increase in resistance due to the joint parts of the source electrode 60 and the plurality of wires 20. Therefore, it is possible to prevent an increase in the ON resistance of the semiconductor device 1.

The plurality of first joint portions J1 are arranged in a staggered manner on the source electrode 60. Thereby, the length along the y direction of the portion where one loop portion L1 of the two wires adjacent to each other in the x direction and another other loop portion L1 on the other wire of the pair face each other in the x direction is reduced. Therefore, when joining one of the two wires which are adjacent in the x direction and then joining the other wire, it is possible to avoid interference between the bonding tool 90 and the loop portion L1 of one of the already joined wires. Therefore, the distance between two adjacent wires can be reduced, and thus a plurality of first joint portions J1 can be more densely arranged on the source electrode 60 along the x direction.

In particular, in the example of FIG. 1, the length D1 of the first joint portion J1 along the y direction is longer than the length of the loop portion L1 along the y direction. As a result, one loop portion L1 of the two wires adjacent to each other in the x direction and the other loop portion L1 do not have a portion facing each other in the x direction. In other words, the first joint portion J1 of one of the two wires adjacent to each other in the x direction and the first joint portion J1 of the other wire have both a portion (a portion which overlaps along the x direction) facing each other along the x direction and a portion (a portion which does not overlap along the x direction) not facing each other. Therefore, the margin for avoiding the interference between the bonding tool 90 and the loop portion L1 of the joined wire can be further reduced. Therefore, it is possible to prevent an increase in the ON resistance of the semiconductor device 1.

As described above, the source electrode 60 and the terminal 30 are electrically connected by wire-bonding a plurality of wires 20. Thereby, the process of electrically connecting the source electrode and the terminal in the semiconductor device 1 can be performed with wire bonding. Therefore, it is possible to reduce the number of devices required for manufacturing and to prevent an increase in the number of steps as compared with the case of manufacturing the semiconductor device 1 by combining other methods in addition to the wire bonding.

According to the semiconductor device of the embodiment, it is possible to prevent an increase in resistance due to the connection between the source electrode 60 and wires, and thus it is possible to prevent an increase in the number of wires. Therefore, the assembly yield of the semiconductor device can be improved.

According to the embodiment, it is possible to form a plurality of first joint portions J1 having a joint area sufficient to prevent an increase in ON resistance while performing wire bonding. Therefore, it is possible to prevent an increase in ON resistance while preventing a decrease in yield.

According to the semiconductor device of the embodiment, the joint area per joint portion in the source electrode 60 is large, so it is possible to prevent the occurrence of joint failure. Therefore, the joint reliability of the semiconductor device can be improved.

1.4 Modification Examples

The embodiment described above may be modified in various ways.

Semiconductor devices according to modification examples will be described below. The semiconductor device according to the modification example will be described below focusing on the differences from the semiconductor device according to the embodiment. The semiconductor device according to the modification example can also achieve the same effect as that of the embodiment.

1.4.1 First Modification Example

In the embodiment described above, the case where each of the wires 20 has multiple first joint portions J1 on the source electrode 60 is described, but the embodiments of the present disclosure are not limited thereto. For example, each wires 20 can have just one first joint portion J1 on the source electrode 60 and this first joint portion J1 extends from the first end to the second end along the y direction of the source electrode 60.

Figure 10:
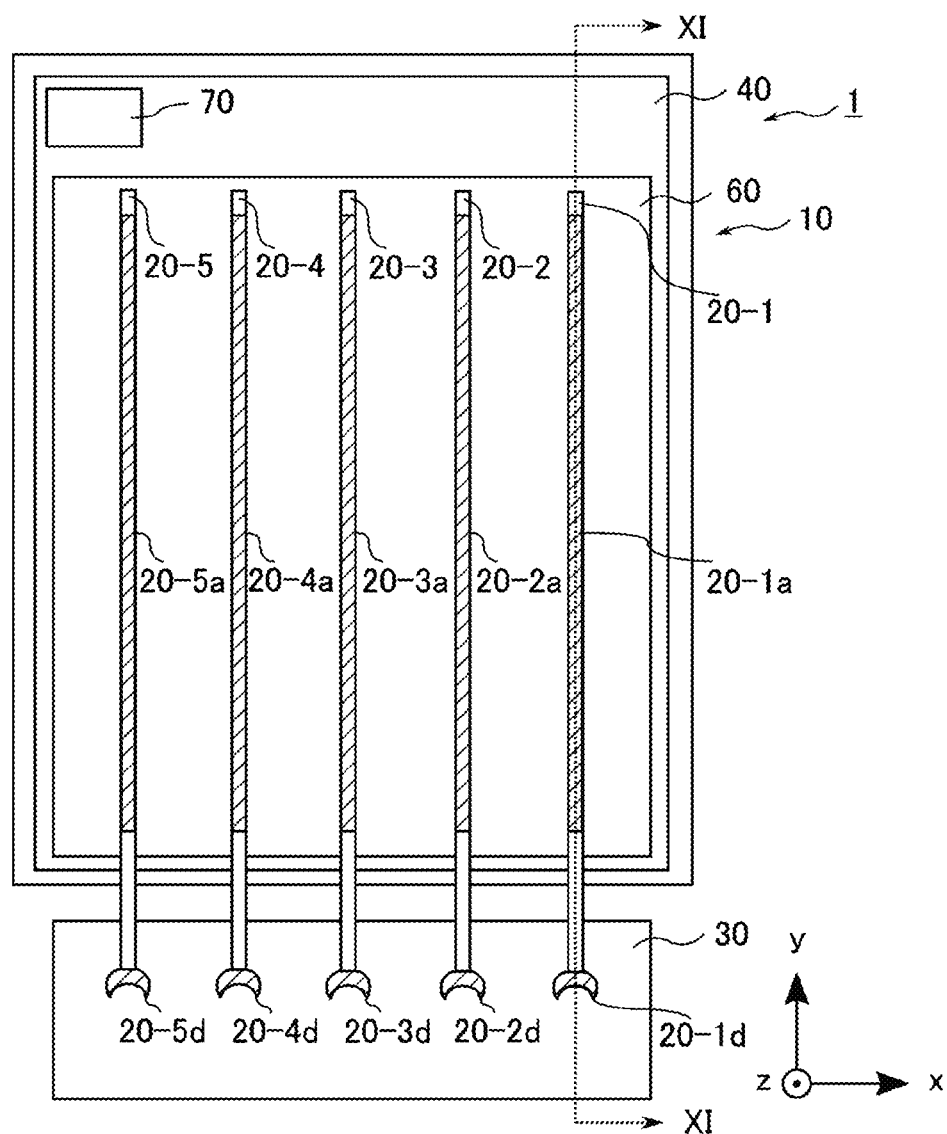
FIG. 10 illustrates a plan view of a semiconductor device according to a first modification example.
Figure 11:
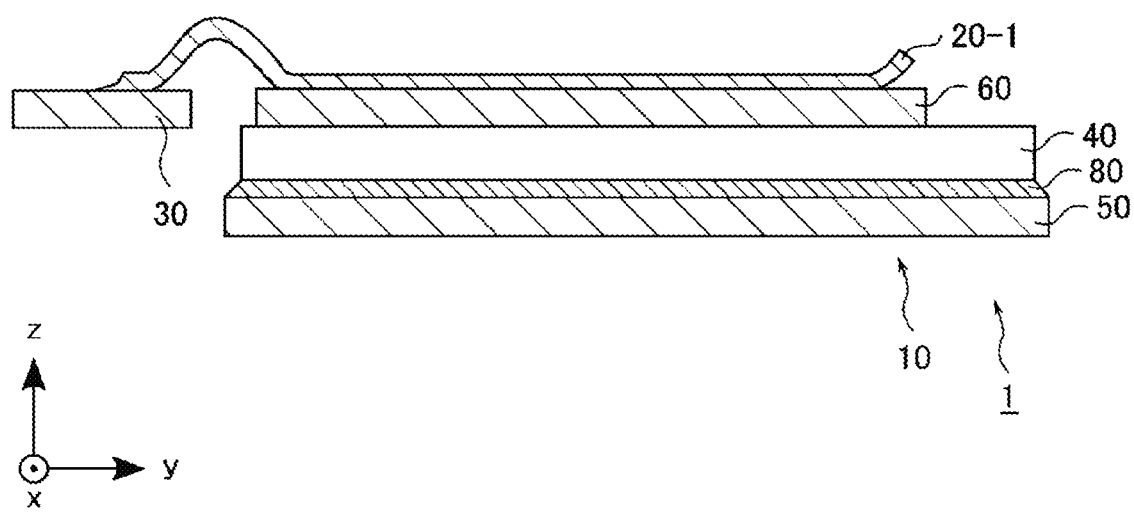
FIG. 11 illustrates a cross-sectional view of the semiconductor device taken along a line XI-XI in FIG. 10.

FIG. 10 illustrates a plan view of the semiconductor device 1 according to a first modification example as viewed from above. FIG. 11 illustrates a cross-sectional view of the semiconductor device 1 including the wire 20-1 taken along the line XI-XI in FIG. 10.

As illustrated in FIG. 10, the wire 20-1 has a joint portion 20-1*a* as the first joint portion J1 and has a joint portion 20-1*d* as the second joint portion J2. The wire 20-2 has a joint portion 20-2*a* as the first joint portion J1 and has a joint portion 20-2*d* as the second joint portion J2. The wire 20-3 has a joint portion 20-3*a* as the first joint portion J1 and a joint portion 20-3*d* as the second joint portion J2. The wire 20-4 has a joint portion 20-4*a* as the first joint portion J1 and a joint portion 20-4*d* as the second joint portion J2. The wire 20-5 has a joint portion 20-5*a* as the first joint portion J1 and a joint portion 20-5*d* as the second joint portion J2. Thus, each of the wires 20 is joined to the source electrode 60 with one just one first joint portion J1.

As illustrated in FIG. 11, the joint portion 20-1*a* of the wire 20-1 is joined to the source electrode 60 from the first end to the second end of the source electrode 60 along the y direction. In other words, the wire 20-1 has no loop portion L1 above the source electrode 60. The length of the joint portion 20-1*a* along the y direction is longer than the length of the joint portion 20-1d along the y direction. Although only one wire 20-1 of the plurality of wires 20 is described with reference to FIG. 11, the other wires 20-2 to 20-5 have the same configuration as the wire 20-1.

According to the first modification example, each of the plurality of wires 20 is joined by one first joint portion J1 from the first end to the second end along the y direction of the source electrode 60. Thereby, each of the plurality of wires 20 can be joined to the source electrode without having a loop portion L1 above the source electrode 60, and thus the joint area of the first joint portion J1 can be made larger. The configuration may be effective, for example, when the source electrode 60 is provided in the central region of the upper surface of the semiconductor substrate 40 and the gate electrode 70 is provided outside the central region as illustrated in FIGS. 1 and 10.

1.4.2 Second Modification Example

Although the source electrode 60 is provided in the central region of the semiconductor substrate 40 in the above-described embodiment and the first modification example, the embodiments of the present disclosure are not limited thereto. For example, the gate electrode 70 may be provided in the central region of the semiconductor substrate 40 and the source electrode 60 may sandwich (or surround) the gate electrode 70.

Figure 12:
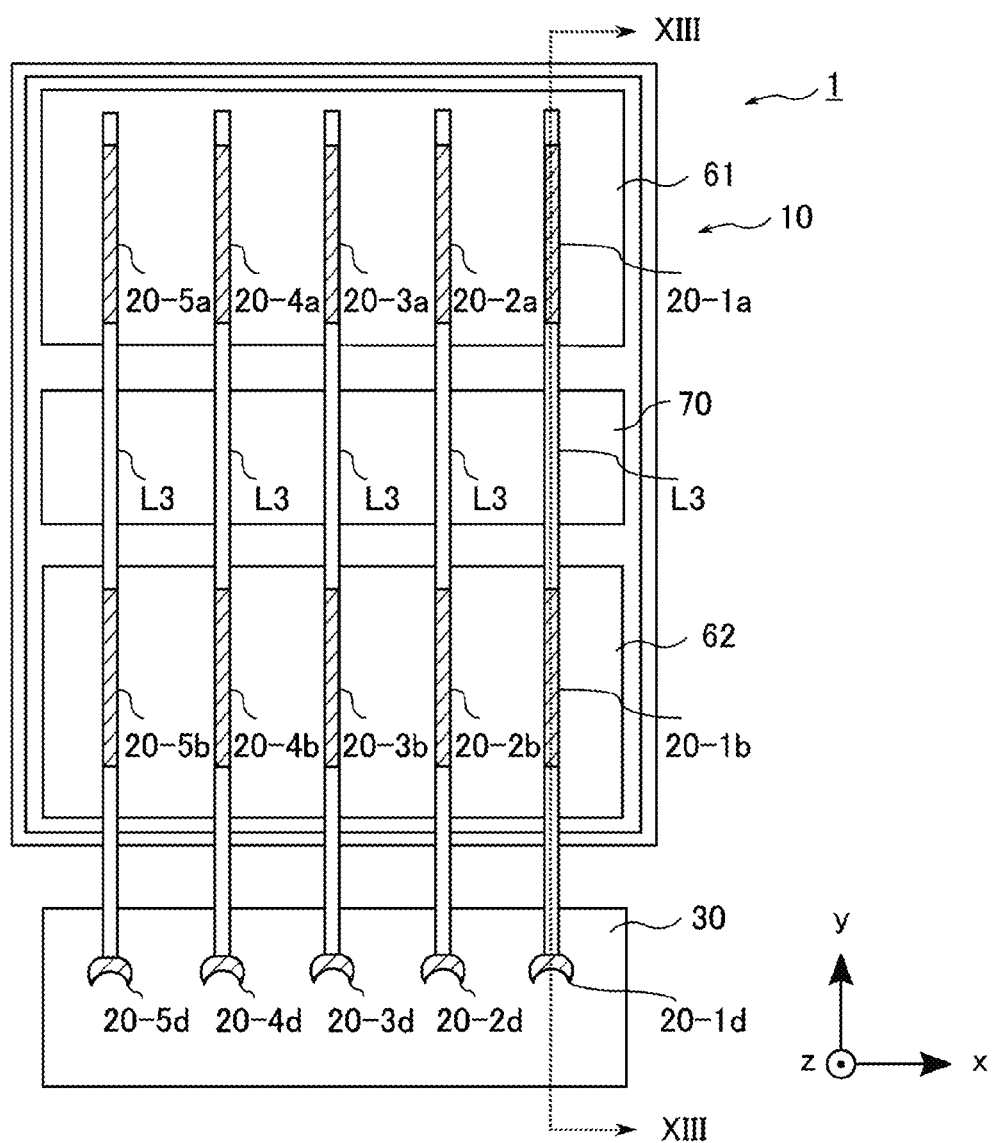
FIG. 12 illustrates a plan view of a semiconductor device according to a second modification example.
Figure 13:
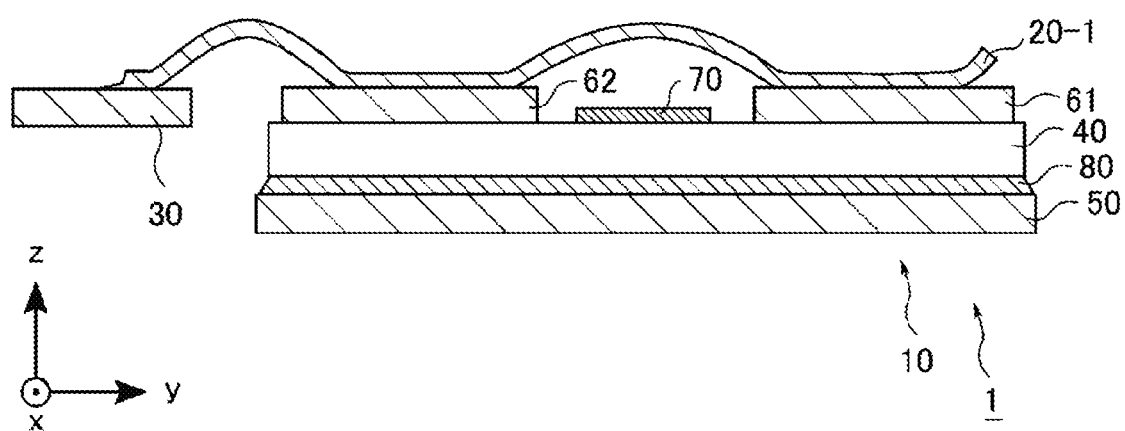
FIG. 13 illustrates a cross-sectional view of the semiconductor device taken along a line XIII-XIII in FIG. 12.

FIG. 12 illustrates a plan view of a semiconductor device 1 according to a second modification example as viewed from above. FIG. 13 illustrates a cross-sectional view of the semiconductor device 1 including the wire 20-1, taken along the line XIII-XIII in FIG. 12.

As illustrated in FIGS. 12 and 13, in the MOSFET 10, the gate electrode 70 is provided in the central region of the semiconductor substrate 40. The source electrodes 61 and 62 sandwich the gate electrode 70 in the y direction. The source electrode 61 is an example of the first region. The source electrode 62 is an example of the second region. In the example of FIG. 12, the source electrode is divided into two source electrodes 61 and 62, but the source electrode is not limited thereto. For example, one source electrode may surround the gate electrode 70 provided in the center of the semiconductor substrate 40. Such a MOSFET 10 may be applied, for example, when the speed required for the switching operation is relatively high.

The wire 20-1 has a joint portion 20-1a with the source electrode 61 and a joint portion 20-1b with the source electrode 62, which are connected via a loop portion L3, as a first joint portion J1 and has a joint portion 20-1d as a second joint portion J2. The wire 20-2 has a joint portion 20-2a with the source electrode 61 and a joint portion 20-2b with the source electrode 62, which are connected via the loop portion L3, as the first joint portions J1 and has a joint portion 20-2d as the second joint portion J2. The wire 20-3 has a joint portion 20-3a with the source electrode 61 and a joint portion 20-3b with the source electrode 62, which are connected via the loop portion L3, as the first joint portions J1 and has a joint portion 20-3d as the second joint portion J2. The wire 20-4 has a joint portion 20-4a with the source electrode 61 and a joint portion 20-4b with the source electrode 62, which are connected via a loop portion L3, as the first joint portions J1 and has a joint portion 20-4d as the second joint portion J2. The wire 20-5 has a joint portion 20-5a with the source electrode 61 and a joint portion 20-5b with the source electrode 62, which are connected via the loop portion L3, as the first joint portions J1 and has a joint portion 20-5d as the second joint portion J2. The loop portion L3 passes above the gate electrode 70 and connects the first joint portion J1 on the source electrode 61 and the first joint portion J1 on the source electrode 62.

The length of each of the first joint portions J1 along the y direction is longer than the length of each of the second joint portions J2 along the y direction.

According to the second modification example, for each of the wires 20, the two first joint portions J1 are connected by a loop portion L3 passing above the gate electrode 70. Thereby, each of the wires 20 can be joined to each of the two source electrodes 61 and 62 which bracket the gate electrode 70, and thus the joint area of the first joint portion J1 can be made larger. The configuration is useful, for example, when the gate electrode 70 is provided in the central region of the semiconductor substrate 40, as illustrated in FIG. 12, and thus the source electrode cannot be provided in the central region.

Other

In the above-described embodiment, the first modification, and the second modification, the lengths of all the joint portions in the source electrode along the y direction are longer than the lengths of the joint portions with the terminal 30 along the y direction. However, the present disclosure is not limited thereto. For example, in a semiconductor device, in addition to a joint portion longer than the length along the y direction of a joint portion with the terminal 30, a ball, a bump, or a stitch having a length along the y direction similar to the joint portion with the terminal 30, may be formed on the source electrode. The ball may be referred to as a ball bonded portion.

Figure 14:
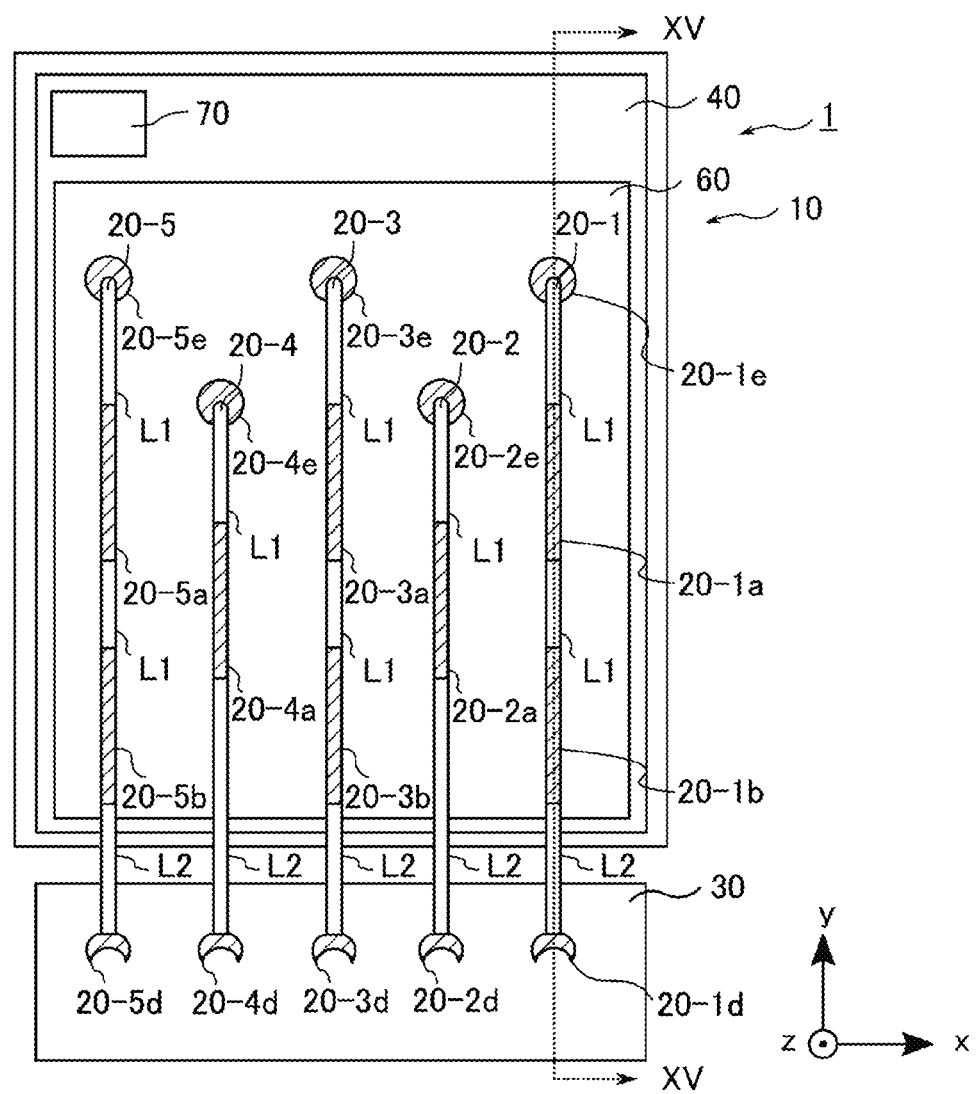
FIG. 14 illustrates a plan view of a semiconductor device according to another embodiment.
Figure 15:
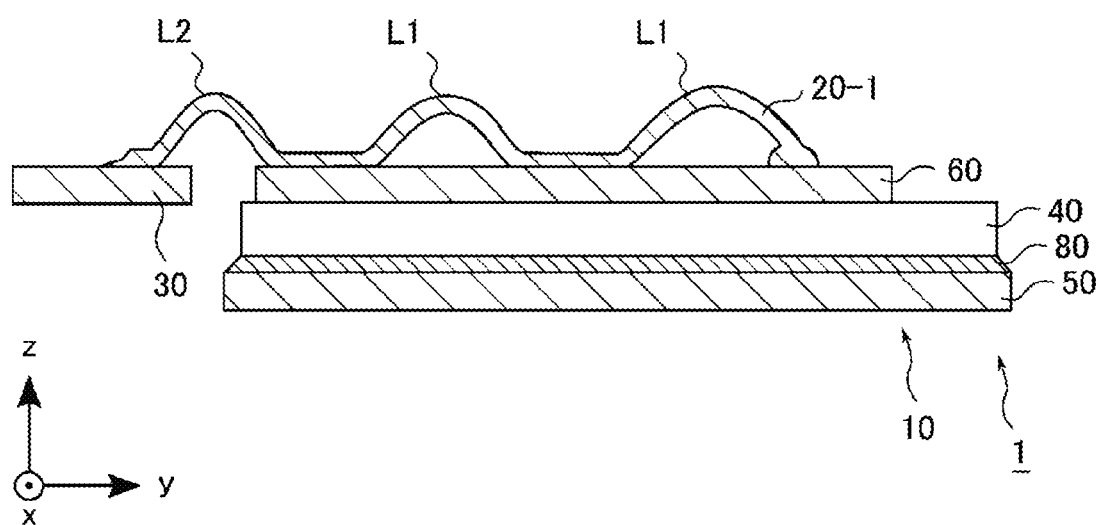
FIG. 15 illustrates a cross-sectional view of the semiconductor device taken along a line XV-XV in FIG. 14.

FIG. 14 illustrates a plan view of a semiconductor device 1 according to another embodiment, in which balls (or bumps) are formed on the source electrode. FIG. 15 illustrates a cross-sectional view of the semiconductor device 1 including the wire 20-1, taken along the line XV-XV in FIG. 14.

As illustrated in FIG. 14, the wire 20-1 has a ball or bump 20-1e, joint portions 20-1a and 20-1b as the first joint portions J1, and a joint portion 20-1d as the second joint portion J2. The wire 20-2 has a ball or bump 20-2e, a joint portion 20-2a as the first joint portion J1, and a joint portion 20-2d as the second joint portion J2. The wire 20-3 has a ball or bump 20-3e, joint portions 20-3a and 20-3b as the first joint portions J1, and a joint portion 20-3d as the second joint portion J2. The wire 20-4 has a ball or bump 20-4e, a joint portion 20-4a as the first joint portion J1, and a joint portion 20-4d as the second joint portion J2. The wire 20-5 has a ball or bump 20-5e, joint portions 20-5a and 20-5b as the first joint portions J1, and a joint portion 20-5d as the second joint portion J2. Thus, each of the wires 20 is joined to the source electrode 60 at the balls or bumps 20-1e to 20-5e and the first joint portion J1.

As illustrated in FIG. 15, the ball or bump 20-1e of the wire 20-1 is formed at the first end of the wire 20-1. In other words, the wire 20-1 has no loop portion L0 above the source electrode 60. The length of the joint portions 20-1a and 20-1b along the y direction is longer than the length of the joint portion 20-1d along the y direction. In FIG. 15, only one wire 20-1 of the plurality of wires 20 is described, but the other wires 20-2 to 20-5 have the same configuration as the wire 20-1.

Even with such a configuration, substantially the same effect as that of the above-described embodiments can be obtained.

In the above-described embodiment, the first modified example, and the second modified example, the diameter of the wire is not particularly limited, but a wire having a diameter of 100 μm or less may be used. With such a structure, when forming the joint portion in manufacturing the semiconductor device, the wire can be joined without pressing the wire very strongly against the source electrode. Therefore, it is possible to obtain a semiconductor device in which damage to the semiconductor element and occurrence of electrical short-circuiting are more reliably prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor chip having an electrode pad;
   a terminal having a terminal pad; and
   a bonding wire extending along a first direction and including:
      a first end portion;
      a first bonded portion bonded to the electrode pad;
      a second bonded portion bonded to the electrode pad;
      a first loop portion between the first bonded portion and the second bonded portion;
      a second loop portion extending over a space between the semiconductor chip and the terminal; and
      a third bonded portion bonded to the terminal pad, the third bonded portion being a wedge bonded portion comprising a second end portion of the bonding wire opposite to the first end portion, wherein
      a length of the first bonded portion in the first direction is greater than a length of the third bonded portion in the first direction,
      a thickness of the first bonded portion is less than a thickness of the first loop portion, and
      a width of the first bonded portion is greater than a width of the first loop portion.

2. The semiconductor device according to claim 1, wherein the first end portion does not directly contact the electrode pad.

3. The semiconductor device according to claim 1, wherein
   the first end portion is a ball bonded portion bonded to the electrode pad, and
   the bonding wire further includes a third loop portion between the first end portion and the first bonded portion.

4. The semiconductor device according to claim 1, wherein a length of the first bonded portion in the first direction is substantially the same as the length of the second bonded portion in the first direction.

5. The semiconductor device according to claim 1, wherein the bonding wire includes no other bonded portion bonded to the electrode pad than the first bonded portion and the second bonded portion.

6. The semiconductor device according to claim 1, wherein
   the semiconductor chip comprises a metal oxide semiconductor field effect transistor (MOSFET), and
   the electrode pad is one of a source electrode pad and a drain electrode pad of the MOSFET.

7. The semiconductor device according to claim 1, wherein
   a length of the first bonded portion is greater than a length of the second loop portion.

8. The semiconductor device according to claim 1, further comprising:
   a second bonding wire extending along the first direction adjacent to the bonding wire, the second bonding wire including:
      a fourth bonded portion bonded to the electrode pad;
      a fifth bonded portion bonded to the electrode pad;
      a third loop portion between the fourth bonded portion and the fifth bonded portion;
      a fourth loop portion extending over the space between the semiconductor chip and the terminal; and
      a sixth bonded portion bonded to the terminal pad, the sixth bonded portion being a wedge bonded portion, wherein
      the first loop portion is offset in the first direction with respect to the third loop portion.

9. A semiconductor device, comprising:
   a semiconductor chip having an electrode pad;
   a terminal having a terminal pad; and
   a plurality of bonding wires extending in a first direction and spaced from each in a second direction different from the first direction, each of the plurality of bonding wires including:
      a first end portion;
      a plurality of first bonded portions bonded to the electrode pad, a first loop portion being between each of the plurality of first bonded portions;
      a second loop portion extending between the semiconductor chip and the terminal; and
      a second bonded portion bonded to the terminal pad, wherein
      the second bonded portion is a wedge bonded portion comprising a second end portion of the bonding wire opposite to the first end portion,
      a length of each of the plurality of first bonded portions in the first direction is greater than a length of the second bonded portion in the first direction,
      a thickness of each of the plurality of first bonded portions is less than a thickness of the first loop portion, and
      a width of each of the plurality of first bonded portions is greater than a width of the first loop portion.

10. The semiconductor device according to claim 9, wherein
    the plurality of bonding wires includes a first bonding wire and a second bonding wire, and
    a number of the plurality of first bonded portions included in the first bonding wire is different from a number of the plurality of first bonded portions included in the second bonding wire.

11. The semiconductor device according to claim 9, wherein
    the plurality of bonding wires includes a first bonding wire and a second bonding wire, and
    the plurality of first bonded portions included in the first bonding wire are offset in the first direction with respect to the plurality of first bonded portions included in the second bonding wire.

12. The semiconductor device according to claim 9, wherein the plurality of first bonded portions included in the plurality of bonding wires have a uniform length in the first direction.

13. The semiconductor device according to claim 9, wherein
the plurality of bonding wires includes a first bonding wire and a second bonding wire,
the second end portion of the first bonding wire is aligned with the second end portion of the second bonding wire in the second direction, and
the first end portion of the first bonding wire is not aligned with the first end portion of the second bonding wire in the second direction.

14. The semiconductor device according to claim 9, wherein
the plurality of bonding wires includes a first bonding wire and a second bonding wire adjacent to each other in the second direction, and
a length in the first direction of the second loop portion included in the first bonding wire is different from a length in the first direction of the second loop portion included in the second bonding wire.

15. A wire bonding method, comprising:
moving a bonding tool toward an electrode pad of a semiconductor chip to join a bonding wire in the bonding tool to the electrode pad;
moving the bonding tool in a first direction parallel to a surface of the electrode pad while the bonding wire is joined to the electrode pad to form a first bonded portion bonded to the electrode pad;
after the first bonded portion is formed, moving the bonding tool away from the electrode pad and then toward the electrode pad to join the bonding wire in the bonding tool to the electrode pad again;
moving the bonding tool in the first direction while the bonding wire is joined to the electrode pad to form a second bonded portion bonded to the electrode pad; and
after the second bonded portion is formed, moving the bonding tool away from the electrode pad and then toward a terminal pad to join the bonding wire to the terminal pad and form a third bonded portion bonded to the terminal pad, the third bonded portion being a wedge bonded portion comprising an end portion of the bonding wire.

16. The wire bonding method according to claim 15, further comprising:
forming a ball bonded portion before the first bonded portion is formed.

17. The wire bonding method according to claim 15, further comprising:
after the third bonded portion is formed, moving the bonding tool toward the electrode pad of the semiconductor chip to join the bonding wire to the electrode pad; and
moving the bonding tool in the first direction while the bonding wire is joined to the electrode pad to form a fourth bonded portion bonded to the electrode pad, the fourth bonded portion extending in parallel to the first bonded portion.

18. The wire bonding method according to claim 15, wherein
a first loop portion of the bonding wire is formed by said moving the bonding tool away from the electrode pad and then toward the electrode pad,
a thickness of the first bonded portion is less than a thickness of the first loop portion, and
a width of the first bonded portion is greater than a width of the first loop portion.

* * * * *